(12) United States Patent
Jacob et al.

(10) Patent No.: US 9,455,140 B2
(45) Date of Patent: Sep. 27, 2016

(54) METHODS OF FORMING DOPED EPITAXIAL SIGE MATERIAL ON SEMICONDUCTOR DEVICES

(71) Applicant: GLOBALFOUNDRIES Inc., Grand Cayman (KY)

(72) Inventors: Ajey Poovannummoottil Jacob, Watervliet, NY (US); Jody A. Fronheiser, Delmar, NY (US); Murat Kerem Akarvardar, Saratoga Springs, NM (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/525,351

(22) Filed: Oct. 28, 2014

(65) Prior Publication Data
US 2016/0118251 A1    Apr. 28, 2016

(51) Int. Cl.
| | | |
|---|---|---|
| *H01L 21/02* | (2006.01) | |
| *H01L 21/265* | (2006.01) | |
| *H01L 21/324* | (2006.01) | |
| *H01L 29/66* | (2006.01) | |
| *H01L 29/78* | (2006.01) | |
| *H01L 21/18* | (2006.01) | |

(52) U.S. Cl.
CPC ...... *H01L 21/02532* (2013.01); *H01L 21/0245* (2013.01); *H01L 21/02381* (2013.01); *H01L 21/02579* (2013.01); *H01L 21/02664* (2013.01); *H01L 21/18* (2013.01); *H01L 29/66628* (2013.01); *H01L 29/66636* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 2007/0235802 A1* | 10/2007 | Chong | ............... H01L 29/66636 257/346 |
| 2013/0234217 A1* | 9/2013 | Lin | ................... H01L 29/66636 257/288 |
| 2014/0011341 A1 | 1/2014 | Maszara et al. | |
| 2015/0021696 A1* | 1/2015 | Sung | ............... H01L 21/823425 257/368 |

OTHER PUBLICATIONS

Balakumar et al., "Fabrication of Thick Germanium-on-Insulator (GeOI) Substrates," Journal of Electronic Materials, 37:944-950, 2008.
Related U.S. Appl. No. 14/471,038 Office Action dated Oct. 15, 2015.

* cited by examiner

*Primary Examiner* — Khaja Ahmad
(74) *Attorney, Agent, or Firm* — Amerson Law Firm, PLLC

(57) ABSTRACT

One illustrative method disclosed herein includes, among other things, performing first and second in situ doping, epitaxial deposition processes to form first and second layers of in situ doped epi semiconductor material, respectively, above a semiconductor substrate, wherein one of the first and second layers has a high level of germanium and a low level of P-type dopant material and the other of the first and second layers has a low level of germanium and a high level of P-type dopant material, and performing a mixing thermal anneal process on the first and second layers so as to form the final silicon germanium material having a high level of germanium and a high level of P-type dopant material.

27 Claims, 4 Drawing Sheets

METHODS OF FORMING DOPED EPITAXIAL SIGE MATERIAL ON SEMICONDUCTOR DEVICES

BACKGROUND OF THE INVENTION

1. Field of the Invention

Generally, the present disclosure relates to the manufacture of semiconductor devices, and, more specifically, to various methods of forming doped epitaxial silicon germanium ($Si_xGe_{1-x}$) material on semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, e.g., field effect transistors (NMOS and PMOS transistors), resistors, capacitors, etc. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region. Such transistor devices come in a variety of shapes and forms, e.g., planar transistor devices, FinFET devices, etc.

The formation of epitaxial semiconductor material, such as SiGe, SiC, is a very common process operation when manufacturing semiconductor devices. For example, such epi semiconductor materials are formed in various locations on various areas of the integrated circuit devices. Such epi semiconductor materials are frequently formed in the source/drain regions of transistor devices. More specifically, it is often the case that transistor devices are formed with raised or embedded source/drain regions that include an epi semiconductor material. In general, a raised source/drain region involves the formation of such epi semiconductor material above the surface of the semiconducting material, whereas formation of an embedded source/drain region involves formation of a recess in the substrate and thereafter filling the recess with the epi semiconductor material.

In manufacturing PMOS devices, device manufacturers typically form epi SiGe materials in the source/drain regions of the device. Since the device is a PMOS device, the source/drain regions must eventually be doped with a P-type dopant material, e.g., boron, boron di-fluoride, etc., for the device to operate as intended. In many cases, it is desirable to form such SiGe materials with different germanium content and with different dopant concentration levels. However, using existing processing techniques, it is very difficult to form an SiGe layer with a relatively high percentage of germanium (greater than 50% Ge) and a relatively high concentration of P-type dopant (e.g., $2-3e^{20}$ ions/cm$^3$). One prior art technique for forming such an SiGe layer involves epi growth of a single layer of $SiGe_{0.4}$ (40% Ge) with in situ doping of the P-type dopant such that the resulting single layer of $SiGe_{0.4}$ has a dopant concentration of about $2-3e^{20}$ ions/cm$^3$ of the P-type dopant material. Another prior art technique for forming such an SiGe layer involves epi growth of a single layer of $SiGe_{0.4}$ (40% Ge) and thereafter performing an ion implantation process to implant the P-type dopant such that the resulting single layer of $SiGe_{0.4}$ has a dopant concentration of about $2-3e^{20}$ ions/cm$^3$ of the P-type dopant material. However, performing ion implantation processes can generate a significant amount of lattice defects, thereby making the nanostructured region defective. Unfortunately, in the case of forming the P-doped epi SiGe layer with in situ doping, if the germanium percentage is increased, there will be an associated decrease in the amount of the P-type dopant that can be incorporated into the layer of epi SiGe material during the epi formation process.

The present disclosure is directed to various methods of forming doped epitaxial SiGe material on semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming doped epitaxial silicon germanium ($Si_xGe_{1-x}$) material on semiconductor devices. One illustrative method disclosed herein includes, among other things, performing first and second in situ doping, epitaxial deposition processes to form first and second layers of in situ doped epi semiconductor material, respectively, above a semiconductor substrate, wherein one of the first and second layers has a high level of germanium and a low level of P-type dopant material and the other of the first and second layers has a low level of germanium and a high level of P-type dopant material, and performing a mixing thermal anneal process on the first and second layers so as to form the final silicon germanium material having a high level of germanium and a high level of P-type dopant material.

Another illustrative method involves, among other things, performing a first in situ doping, epitaxial deposition process to form a first layer of in situ P-doped epi semiconductor material on a surface of a silicon substrate, performing a second in situ doping, epitaxial deposition process to form a second layer of in situ P-doped epi semiconductor material on the first layer, wherein the first layer has a high level of germanium and a low level of P-type dopant material and the second layer has a low level of germanium and a high level of P-type dopant material, and performing a mixing thermal anneal process on the first and second layers so as to form the final silicon germanium material having a high level of germanium and a high level of P-type dopant material.

BRIEF DESCRIPTION OF THE DRAWINGS

The disclosure may be understood by reference to the following description taken in conjunction with the accompanying drawings, in which like reference numerals identify like elements, and in which.

Figure 1A:
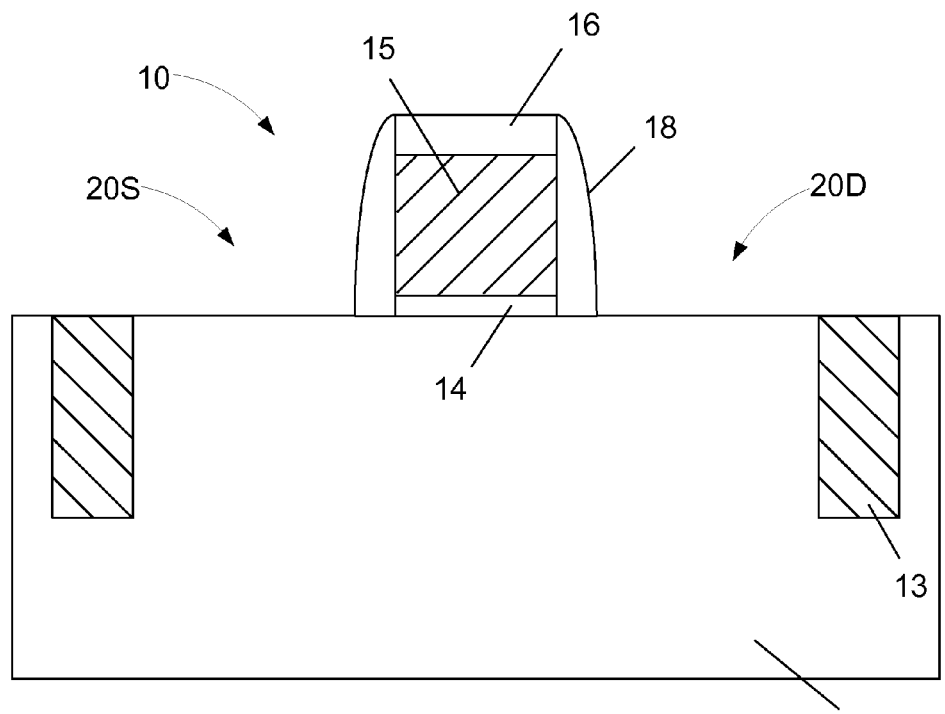
FIGS. 1A-1G depict various methods disclosed herein for forming doped epitaxial silicon germanium ($Si_xGe_{1-x}$) material on semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming doped epitaxial silicon germanium ($Si_xGe_{1-x}$) material on semiconductor devices. The methods disclosed herein may be employed to form epi SiGe on any portion of any type of a semiconductor device. For purposes of disclosing the present invention, this application will depict the illustrative example wherein the epi SiGe material is formed for the source/drain regions of an illustrative planar device. Of course, the methods disclosed herein may be used to form epi SiGe material on 3D devices, such as a FinFET device. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the present method is applicable to a variety of devices, including, but not limited to, logic devices, memory devices, etc., and the methods disclosed herein may be employed to form P-type semiconductor devices. With reference to the attached figures, various illustrative embodiments of the methods and devices disclosed herein will now be described in more detail.

FIG. 1A (cross-sectional view) depicts an illustrative transistor device 10 that may be formed in accordance with the methods disclosed herein. The device 10 is formed above a semiconductor substrate 12. The illustrative substrate 12 may be a bulk semiconductor substrate, or it may be the active layer of a so-called SOI (silicon-on-insulator) substrate or a so-called SGOI (silicon/germanium on insulator) substrate. Thus, the terms "substrate," "semiconductor substrate" or "semiconducting substrate" should be understood to cover all semiconductor materials and all forms of such semiconductor materials. The device 100 may be either a P-type FinFET device or an N-type FinFET device.

As shown in FIG. 1A, the process includes the formation of an illustrative planar transistor structure 10 above the semiconducting substrate 12 in an active area defined by a shallow trench isolation structure 13. At the point of fabrication depicted in FIG. 1A, the device 10 includes a gate insulation layer 14, a gate electrode 15, a gate cap layer 16 and sidewall spacers 18. Also depicted are illustrative regions where a source region (20S) and a drain region (20D) for the device 10 will be formed. The various components and structures of the device 10 may be formed using a variety of different materials and by performing a variety of known techniques. For example, the gate insulation layer 14 may be comprised of silicon dioxide, the gate electrode 15 may be comprised of polysilicon and the gate cap layer 16 and the sidewall spacers 18 may be comprised of silicon nitride. Of course, those skilled in the art will recognize that there are other features of the transistor 10 that are not depicted in the drawings for purposes of clarity. For example, so-called halo implant regions are not depicted in the drawings, as well as various layers or regions of silicon germanium that are typically found in high-performance PMOS transistors. The gate structure depicted in FIG. 1A, i.e., the gate insulation layer 14 and the gate electrode 15, are intended to be representative in nature as the gate structure may be a final gate structure or a sacrificial gate structure that is used in forming transistor devices using a replacement gate process.

Figure 1B:
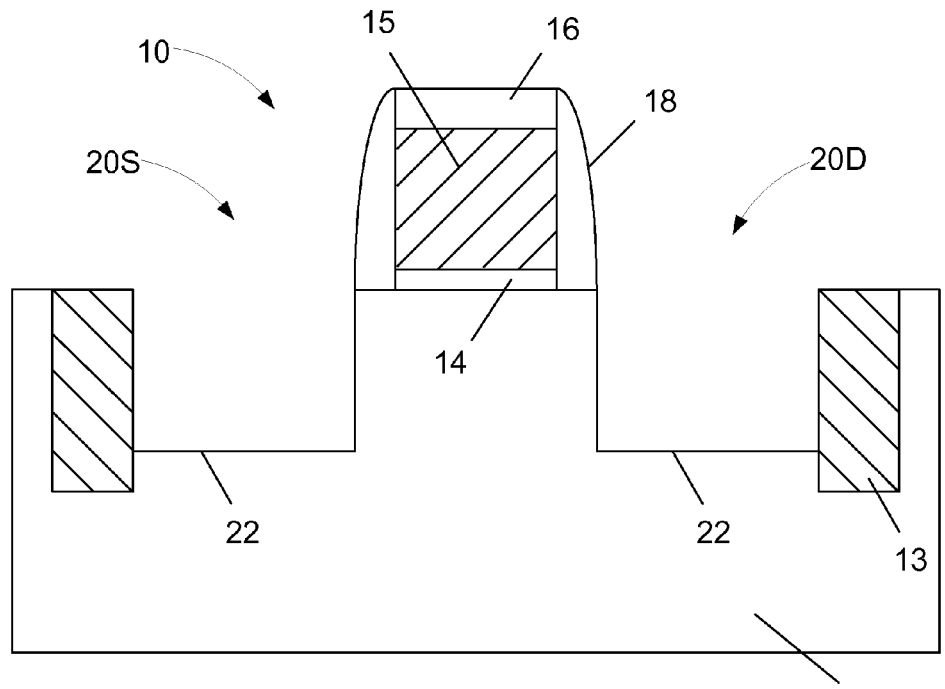

As shown in FIG. 1B, one or more etching processes are performed to form recesses 22 in the substrate 12. The depth of the recesses 22 may vary depending upon the particular application. A masking layer, e.g., a photoresist mask, that may be employed in forming the cavities 22 is not depicted in FIG. 1B. As will be appreciated by those skilled in the art after a complete reading of the present application, the methods disclosed herein may be employed in forming transistor devices 10, with or without the formation of the recesses 22, i.e., the epi SiGe material may be formed as part of a raised source/drain region of the device 10.

In general, the methods disclosed herein involve forming a final doped SiGe semiconductor material having a high amount of germanium (which as used herein and in the claims shall mean a layer of SiGe with a germanium concentration of 50% or greater) and a high concentration of P-type dopant material (which as used herein and in the claims shall mean a dopant concentration of at least $2\text{-}3e^{20}$ ion/$cm^3$) by forming a plurality of in situ doped layers of epi semiconductor material, wherein the layers of in situ doped epi semiconductor material (1) have different germanium concentrations and/or (2) different concentrations of the P-doped dopant material.

Figure 1C:
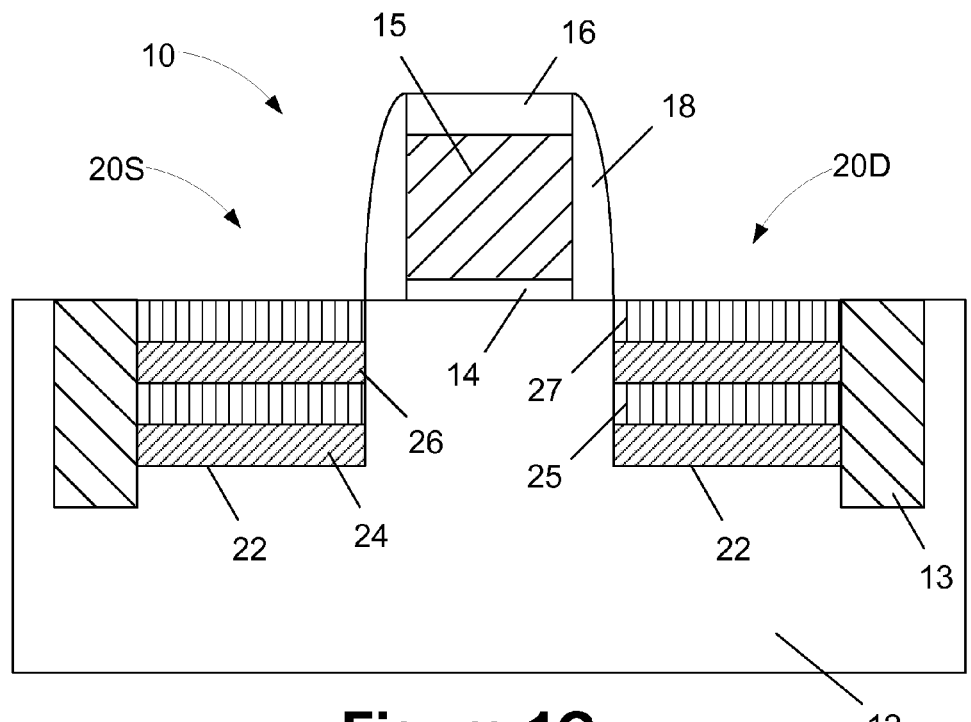

FIG. 1C depicts an illustrative example wherein four illustrative layers of in situ doped epi semiconductor material are sequentially formed in the cavities 22 in the substrate 12. In the example depicted in FIG. 1C, a plurality of epi semiconductor material layers 24-27 are sequentially formed in the cavities 22. More specifically, in one particular embodiment, the first epi semiconductor layer 24 is a layer of in situ doped epi SiGe material that was formed on the substrate 12 in the cavity 22; the second epi semiconductor layer 25 is a layer of in situ doped epi silicon that was formed on the first epi semiconductor layer 24; the third epi semiconductor layer 26 is a layer of in situ doped epi SiGe material that was formed on the second epi semiconductor layer 25; and the fourth epi semiconductor layer 27 is a layer of in situ doped epi silicon that was formed on the third epi semiconductor layer 26. As will be appreciated by those skilled in the art after a complete reading of the present application, the four layers depicted in FIG. 1C are by way of example as any desired number of such layers of material may be formed on the device 10. The alternating layers may be formed in any desired order, e.g., the silicon layers may be formed before the SiGe layers are formed. Moreover, the number of layers of different types of material, e.g., SiGe, Ge, Si, need not be the same in the cavities 22. For example, in the example depicted in FIG. 1C, the second layer of epi silicon 25 may be omitted. In some cases, the layers of material depicted in FIG. 1C need not be formed in a sequentially interleaved fashion. That is, with reference to FIG. 1C, the epi silicon layer 25 may be omitted such that the epi SiGe layer 26 is formed on the epi SiGe layer 24. In other cases, all of the layers 24-27 may be layers of epi SiGe material with different levels of germanium and different concentrations of P-type dopant materials.

Figure 1D:
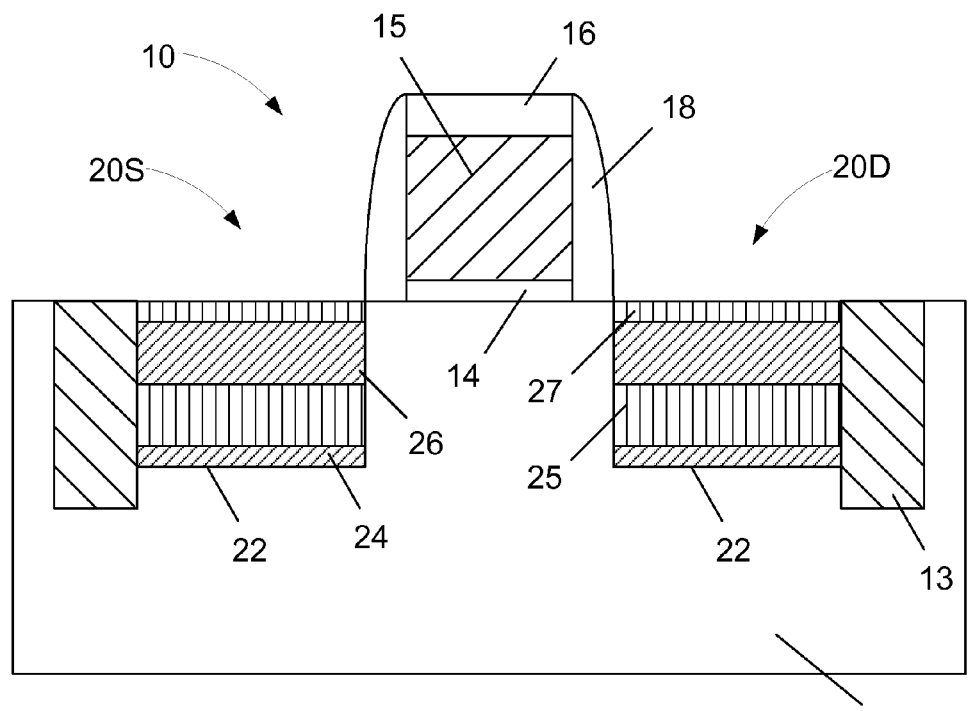

Additionally, in the example depicted in FIG. 1C, the layers 24-27 are depicted as each being formed to substantially the same thickness. However, the various layers 24-27 may all be formed to different thicknesses, as depicted in FIG. 1D.

Figure 1E:
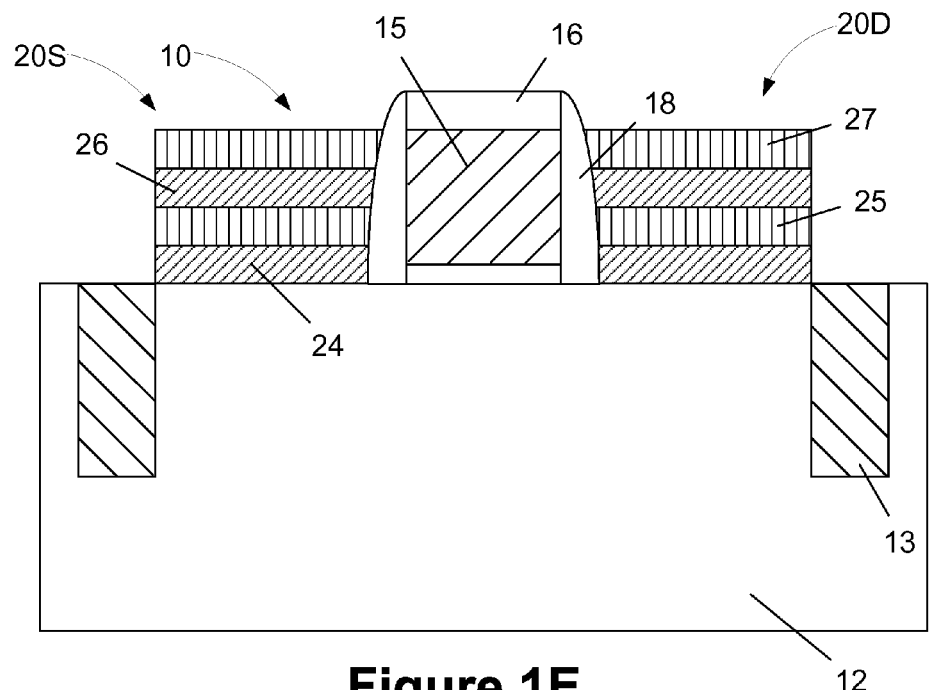

The presently disclosed inventions are not limited to the illustrative example wherein layers of epi semiconductor material are formed in recesses 22 that are formed in the substrate 12. Rather, as depicted in FIG. 1E, the methods disclosed herein may be employed in forming the epi semiconductor materials discussed herein above the surface of the substrate 12, i.e., the methods disclosed herein may be used in forming epi semiconductor material for raised source/drain regions on transistor devices. For purposes of disclosing the present invention, the embodiment depicted in FIG. 1C will be referenced in the remainder of this application.

In general, the layers 24-27 of epi semiconductor material will be formed with different amounts of germanium and different concentrations of P-type dopant material. The layers 24-27 may be made of substantially pure silicon, substantially pure germanium or silicon-germanium ($Si_{(1-x)}Ge_x$), where x ranges from 0 to 1. In the case of a silicon-germanium material, the value of x is greater than 0 but less than 1. In general, one or more of the epi semiconductor materials 24-27 will be formed with a high level of germanium (which as used herein and in the claims shall mean a layer of epi semiconductor material with a germanium concentration of 50% or greater) with a low concentration of the P-type dopant material (which as used herein and in the claims shall mean a dopant concentration of less than $1e^{20}$ ion/cm$^3$). Of course, in the case where there are two such layers of material, e.g., the layers 24 and 26, the amount of germanium and/or the concentration of P-type dopant in the layers 24, 26 may be different from one another. Continuing, an additional one or more of the layers of epi semiconductor material, e.g., the layers 25 and 27, will be formed with a low level of germanium (which as used herein and in the claims shall mean a layer of epi semiconductor material with a germanium concentration of less than 50%) with a high concentration of the P-type dopant material (which as used herein and in the claims shall mean a dopant concentration of at least $2e^{20}$ ion/cm$^3$). Of course, the concentration of P-type dopant in the layers 25, 27 may be different from one another.

Figure 1F:
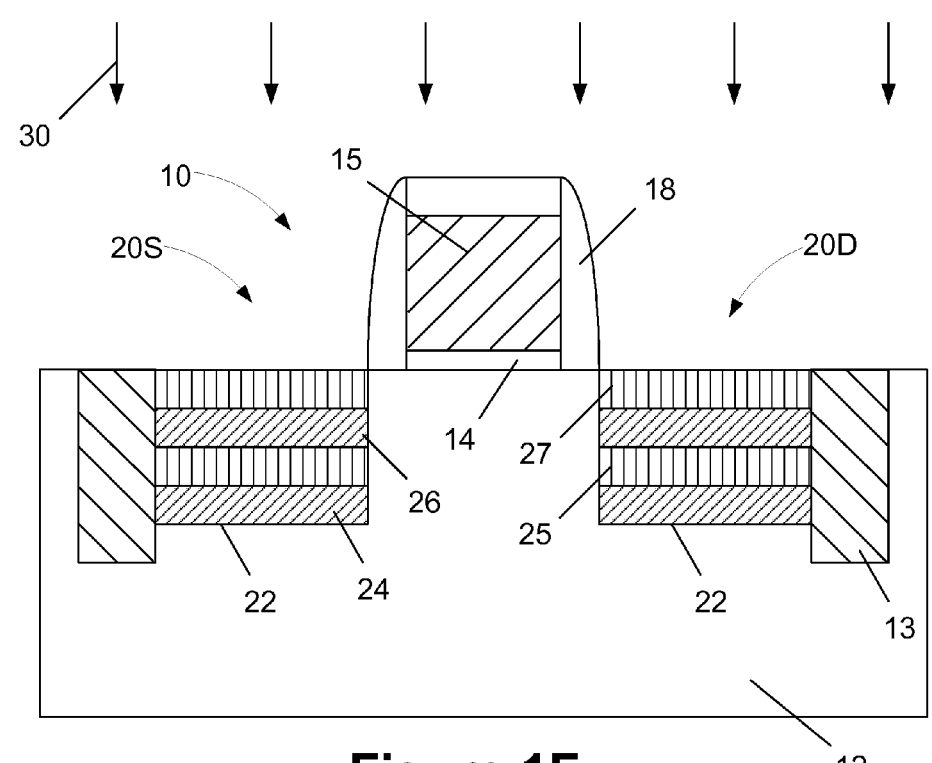
Figure 1G:
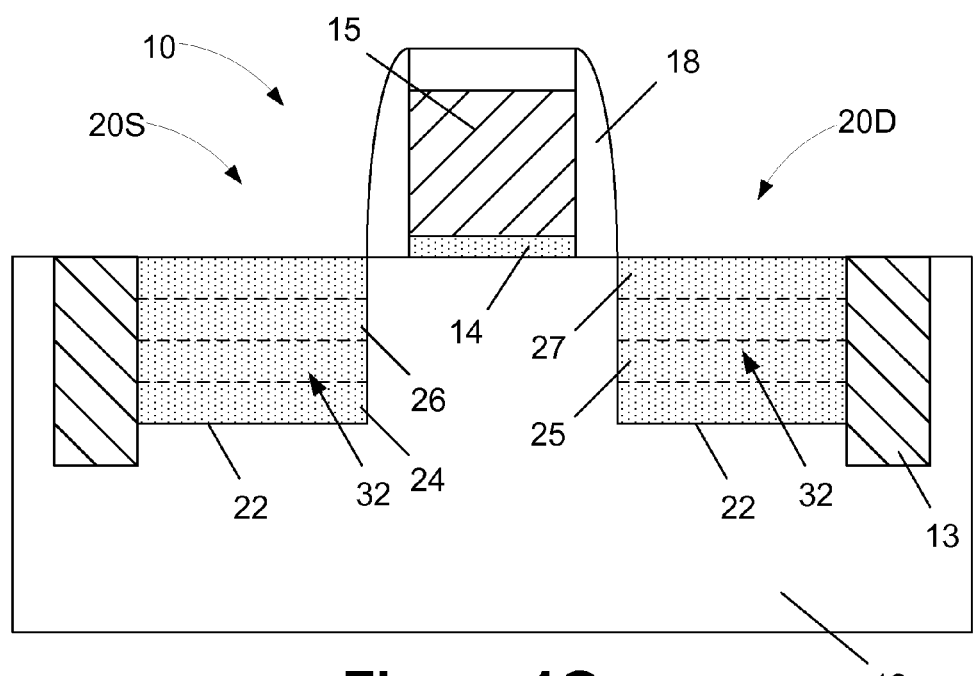

FIGS. 1F-1G depict the device 10 after a mixing thermal anneal process 30 was performed on the device so as to produce the final silicon germanium material 32 (see FIG. 1G) having the desired high level of germanium and the desired high concentration of the P-type dopant material. The mixing thermal anneal process 30 causes the germanium and dopant materials to migrate from and among the various layers of epi semiconductor material 24-27 to thereby form the final silicon germanium material 32. In one illustrative embodiment, the mixing thermal anneal process 30 may be performed at a temperature that falls within the range of about 600-1100° C. using an RTA furnace, a laser anneal process or a traditional furnace, depending upon the particular application. In general, the longer the duration of the mixing thermal anneal process 30 or high-temperature spike anneal, the more complete will be the mixing of the germanium and P-type dopant materials from the layers 24-27, and the lower may be the temperature used in the mixing thermal anneal process 30. Conversely, the shorter the duration of the mixing thermal anneal process 30, the less complete will be the mixing of the germanium and P-type dopant materials from the layers 24-27, and the higher may be the temperature used in the mixing thermal anneal process 30. At a high level, the methods disclosed herein involve establishing a target value for the germanium content and the P-type dopant concentration in the final silicon germanium material 32 for the device. Thereafter, the germanium concentration, P-type dopant concentration and thickness of each of the multiple layers of the in situ doped semiconductor material layers, e.g., the layers 24-27, are engineered and selected such that, after the mixing thermal anneal process 30 is performed, the resulting final silicon germanium material 32 will have the target or desired high level of germanium and high concentration of the P-type dopant material. The multiple layers of epi semiconductor material, e.g., the layers 24-27, are essentially a volume of material, each of which contribute a portion of the germanium and P-type dopants that will be present in the final SiGe material 32 after the mixing thermal anneal process 30 is performed. By formation of the multiple layers of in situ doped epi semiconductor layer as disclosed herein and thereafter performing the mixing thermal anneal process 30, the final silicon germanium material 32 may be formed with a higher germanium content and higher P-type dopant material concentration than can be obtained by either (1) forming the final epi semiconductor material as a single layer of material that is doped in situ, or (2) by forming a single layer of epi SiGe material and thereafter performing an ion implantation process to introduce P-type dopants into the single layer of epi SiGe material. Of course, an ion implantation process may be performed to introduce additional P-type dopant materials into layers 24-27 and/or the final epi SiGe material 32.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a final silicon germanium material, the method comprising:
performing first and second in situ doping, epitaxial deposition processes to form first and second layers of in situ doped epi semiconductor material, respectively, above a semiconductor substrate, wherein one of said first and second layers has a high level of germanium and a low level of P-type dopant material and the other of said first and second layers has a low level of germanium and a high level of P-type dopant material; and
performing a mixing thermal anneal process on said first and second layers, wherein said germanium and P-type dopant materials comprising each of said first and second layers migrate from and among said first and second layers during said mixing thermal anneal process so as to form said final silicon germanium material comprising an entirety of said first layer and an entirety of said second layer, an entirety of said final silicon germanium material formed by said mixing thermal anneal process having a high level of germanium and a high level of P-type dopant material.

2. The method of claim 1, wherein said substrate is a silicon substrate, said first layer is formed on said substrate and said second layer is formed on said first layer.

3. The method of claim 1, wherein said substrate is a silicon substrate, said second layer is formed on said substrate and said first layer is formed on said second layer.

4. The method of claim 1, wherein said substrate is a silicon substrate, said first layer is silicon germanium ($Si_{(1-x)}Ge_x$), where x has a value greater than 0.5 but less than 1, and said second layer is substantially pure silicon.

5. The method of claim 1, wherein said substrate is a silicon substrate, said first layer is silicon germanium ($Si_{(1-x)}Ge_x$), where x has a value greater than 0 but less than 1, and said second layer is silicon germanium ($Si_{(1-x)}Ge_x$), where x has a value greater than 0 but less than 1.

6. The method of claim 1, wherein performing said mixing thermal anneal process comprises performing said mixing thermal anneal process at a temperature that falls within the range of 600-1100° C.

7. The method of claim 1, wherein, prior to forming said first and second layers, the method further comprises forming a recess in said substrate and thereafter forming said first and second layers in said recess.

8. The method of claim 1, wherein one of said first and second layers is formed on and in contact with an upper surface of said substrate.

9. The method of claim 1, wherein said first and second layers are formed to the same thickness.

10. The method of claim 1, wherein said first and second layers are formed to different thicknesses.

11. The method of claim 1, where one of said first and second layers is substantially pure germanium or substantially pure silicon.

12. The method of claim 1, further comprising performing an ion implantation process to implant additional P-type dopant material into one of said first and second layers.

13. The method of claim 1, wherein said final silicon germanium material is part of a source or a drain region of a transistor device.

14. The method of claim 1, wherein a germanium concentration in each of said first and second layers is different.

15. A method of forming a final silicon germanium material, the method comprising:
performing a first in situ doping, epitaxial deposition process to form a first layer of in situ P-doped epi semiconductor material on a surface of a silicon substrate;
performing a second in situ doping, epitaxial deposition process to form a second layer of in situ P-doped epi semiconductor material on said first layer, wherein said first layer has a high level of germanium and a low level of P-type dopant material and said second layer has a low level of germanium and a high level of P-type dopant material; and
performing a mixing thermal anneal process on said first and second layers, wherein said germanium and P-type dopant materials comprising each of said first and second layers migrate from and among said first and second layers during said mixing thermal anneal process so as to form said final silicon germanium material comprising an entirety of said first layer and an entirety of said second layer, an entirety of said final silicon germanium material formed by said mixing thermal anneal process having a high level of germanium and a high level of P-type dopant material.

16. The method of claim 15, wherein said first layer is silicon germanium ($Si_{(1-x)}Ge_x$), where x has a value greater than 0.5 but less than 1, and said second layer is substantially pure silicon.

17. The method of claim 15, wherein said first layer is silicon germanium ($Si_{(1-x)}Ge_x$), where x has a value greater than 0.5 but less than 1, and said second layer is silicon germanium ($Si_{(1-x)}Ge_x$), where x has a value greater than 0 but less than 0.5.

18. The method of claim 15, wherein performing said mixing thermal anneal process comprises performing said mixing thermal anneal process at a temperature that falls within the range of 600-1100° C.

19. The method of claim 15, wherein, prior to forming said first and second layers, the method further comprises forming a recess in said substrate and thereafter forming said first and second layers in said recess.

20. The method of claim 15, wherein said first and second layers are formed to the same thickness.

21. The method of claim 15, wherein said first and second layers are formed to different thicknesses.

22. The method of claim 15, where one of said first and second layers is substantially pure germanium or substantially pure silicon.

23. The method of claim 15, further comprising performing an ion implantation process to implant additional P-type dopant material into one of said first and second layers.

24. The method of claim 15, wherein said final silicon germanium material is part of a source or a drain region of a transistor device.

25. A method of forming a final silicon germanium material, the method comprising:
performing a first in situ doping, epitaxial deposition process to form a first layer of in situ P-doped epi semiconductor material on a surface of a silicon substrate;
performing a second in situ doping, epitaxial deposition process to form a second layer of in situ P-doped epi semiconductor material on said first layer, wherein said first layer has a low level of germanium and a high level of P-type dopant material and said second layer has a high level of germanium and a low level of P-type dopant material; and performing a mixing thermal anneal process on said first and second layers, wherein said germanium and P-type dopant materials comprising each of said first and second layers migrate from and among said first and second layers during said mixing thermal anneal process so as to form said final silicon germanium material comprising an entirety of said first layer and an entirety of said second layer, an entirety of said final silicon germanium material formed by said mixing thermal anneal process having a high level of germanium and a high level of P-type dopant material.

26. The method of claim 25, wherein said first layer is substantially pure silicon and said second layer is silicon germanium ($Si_{(1-x)}Ge_x$), where x has a value greater than 0.5 but less than 1.

27. The method of claim 25, wherein said first layer is silicon germanium ($Si_{(1-x)}Ge_x$), where x has a value greater than 0 but less than 0.5, and said second layer is silicon germanium ($Si_{(1-x)}Ge_x$), where x has a value greater than 0.5 but less than 1.

* * * * *